United States Patent
Kim et al.

(10) Patent No.: US 12,334,143 B2
(45) Date of Patent: Jun. 17, 2025

(54) POWER LEVEL COMPARATOR WITH SWITCHING INPUT

(71) Applicant: QUALCOMM Incorporated, San Diego, CA (US)

(72) Inventors: Seohee Kim, San Diego, CA (US); Chulmin Jung, San Diego, CA (US); Xiao Chen, San Diego, CA (US); Hanil Lee, San Diego, CA (US); Venugopal Boynapalli, San Diego, CA (US); Jung Pill Kim, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 304 days.

(21) Appl. No.: 18/306,167

(22) Filed: Apr. 24, 2023

(65) Prior Publication Data

US 2024/0355381 A1   Oct. 24, 2024

(51) Int. Cl.
*G11C 11/413* (2006.01)
*H03K 5/24* (2006.01)
*H10B 10/00* (2023.01)

(52) U.S. Cl.
CPC .............. *G11C 11/413* (2013.01); *H03K 5/24* (2013.01); *H10B 10/18* (2023.02)

(58) Field of Classification Search
CPC ..... G11C 11/413; G11C 11/417; G11C 5/143; G11C 2207/2227; H03K 5/24; H10B 10/18

See application file for complete search history.

(56) References Cited

U.S. PATENT DOCUMENTS

| 4,617,473 | A | 10/1986 | Bingham | |
|---|---|---|---|---|
| 10,090,674 | B2* | 10/2018 | Elsayed | H02J 1/10 |
| 10,921,839 | B2* | 2/2021 | Hsu | G05F 3/02 |
| 11,175,685 | B2* | 11/2021 | Hubbard | G05F 1/465 |

(Continued)

FOREIGN PATENT DOCUMENTS

WO   WO-2024263275 A1 * 12/2024 ............... G05F 1/46

OTHER PUBLICATIONS

International Search Report and Written Opinion—PCT/US2024/023143—ISA/EPO—Jun. 6, 2024.

(Continued)

*Primary Examiner* — Seokjin Kim
(74) *Attorney, Agent, or Firm* — Haynes and Boone, LLP

(57) ABSTRACT

An integrated circuit is disclosed that includes a power supply multiplexer for selecting between a first power supply voltage and a second power supply voltage to provide a selected power supply voltage to a memory. A controller includes a comparator stage having a comparator with switchable inputs so that the comparator stage may control a binary state of a first output signal responsive to whether the first power supply voltage is greater than the second power supply voltage plus a voltage offset of the comparator. Similarly, the comparator stage may control a binary state of a second output signal responsive to whether the first power supply voltage is greater than the second power supply voltage minus the voltage offset. The controller controls the selection by the power supply multiplexer responsive to the binary states of the first and second output signals.

24 Claims, 8 Drawing Sheets

(56) References Cited

U.S. PATENT DOCUMENTS

| | | | | |
|---|---|---|---|---|
| 2014/0346878 | A1* | 11/2014 | Umeyama | G06F 1/263 |
| | | | | 307/52 |
| 2017/0085081 | A1* | 3/2017 | Elsayed | H02J 1/10 |
| 2019/0064866 | A1* | 2/2019 | Hsu | G05F 3/02 |
| 2022/0029435 | A1* | 1/2022 | Bartels | H02J 7/0013 |
| 2024/0429908 | A1* | 12/2024 | Pant | G05F 1/46 |

OTHER PUBLICATIONS

More S., et al., "Reducing Impact of Degradation on Analog Circuits by Chopper Stabilization and Autozeroing", Quality Electronic Design (ISQED), 2011 12th International Symposium on, IEEE, Mar. 14, 2011, 6 Pages, XP031869202, figures 7,8.

* cited by examiner

POWER LEVEL COMPARATOR WITH SWITCHING INPUT

TECHNICAL FIELD

This application relates to integrated circuit memories, and more particularly to a power level comparator with a switching input for selecting a power supply voltage for an integrated circuit memory.

BACKGROUND

An integrated circuit with a digital core such as a processor will typically have various operating modes in which a core domain power supply voltage for the digital core is varied according to the operating mode. In a high-performance mode, the core domain power supply voltage is increased. In contrast, the core domain power supply is decreased for a low-performance or quiescent mode. During the high-performance mode, it is advantageous for the memory be powered by the increased core domain power supply voltage so that the memory performance is also enhanced. In a low-performance mode, the core domain power supply voltage is reduced so as to conserve power. The memory may continue to be powered by this reduced core domain power, which must power not only a memory bitcell array but also associated peripheral logic for the write and read paths to the bitcell array.

The peripheral logic may not work correctly if its power supply voltage drop below a minimum voltage. Should the core domain power supply voltage drop below this minimum voltage and the memory continue to be powered by the core domain power supply voltage, the memory may malfunction. It is thus conventional for the integrated circuit to include a power supply multiplexer that selects between the core domain power supply voltage and a memory domain power supply voltage to provide a selected power supply voltage to power the bitcell array. This selection by the power supply multiplexer is subject to inaccuracies that may cause the memory to have performance issues.

SUMMARY

In accordance with an aspect of the disclosure, an integrated circuit is provided that includes: a memory including a bitcell array; a first voltage rail for a first power supply voltage; a second voltage rail for a second power supply voltage; a power supply multiplexer configured to select between the first power supply voltage and the second power supply voltage to provide a selected power supply voltage for powering the bitcell array; and a controller including a comparator stage configured to switch between a first configuration in which a first input terminal of a comparator in the comparator stage is coupled to the first voltage rail and in which a second input terminal of the comparator is coupled to the second voltage rail and a second configuration in which the first input terminal is coupled to the second voltage rail and in which the second input terminal is coupled to the first voltage rail, the controller being configured to control the power supply multiplexer to select between the first power supply voltage and the second power supply voltage responsive to a first output signal and a second output signal of the comparator stage during an operation of the comparator stage in the first configuration and in the second configuration.

In accordance with another aspect of the disclosure, a method of selecting a power supply voltage is provided that occurs during a transition of a first power supply voltage from being less than a second power supply voltage to being greater than the second power supply voltage, the method including: asserting a first output signal responsive to a first power supply voltage being greater than a sum of a second power supply voltage and a comparator offset voltage; asserting a second output signal responsive to the first power supply voltage being greater than the second power supply voltage minus the comparator offset voltage; and controlling a power supply multiplexer to select for the first power supply voltage responsive to an assertion of both the first output signal and the second output signal to power a bitcell array in a memory with the first power supply voltage.

In accordance with yet another aspect of the disclosure, an integrated circuit is provided that includes: a power supply multiplexer; and a controller configured to control the power supply multiplexer to select between a first power supply voltage and a second power supply voltage to provide a selected power supply voltage responsive to a determination of whether the first power supply voltage is greater than the second power supply voltage plus a voltage offset and responsive to a determination of whether the first power supply voltage is greater than the second power supply voltage minus the voltage offset.

These and other advantageous features may be better appreciated through the following detailed description.

Implementations of the present disclosure and their advantages are best understood by referring to the detailed description that follows. It should be appreciated that like

DETAILED DESCRIPTION

A power supply multiplexer is provided that is controlled by a controller for improved performance to prevent an under-voltage condition or selection of a less-than-optimal voltage for an integrated circuit embedded memory. During a high-performance mode in which a core domain power supply voltage is greater than a memory domain power supply voltage, the controller controls the power supply multiplexer to select for the core domain power supply voltage so that a bitcell array (and associated peripheral logic) in the memory may have a higher operating speed. But during a low-power mode in which the memory domain power supply voltage is greater than the core domain power supply voltage, the controller controls the power supply multiplexer to select for the memory domain power supply voltage.

To perform this selection, the controller includes a comparator stage having a comparator that compares the core domain power supply voltage to the memory domain power supply voltage to determine which voltage is greater than the other. The comparator, like any comparator, is not ideal but instead operates with a certain voltage offset. In other words, suppose that the comparator receives a first voltage at a non-inverting input terminal to the comparator and receives a second voltage at an inverting terminal. Given this input terminal coupling, an output signal of an ideal comparator will be asserted when the comparator detects that the first voltage is greater than the second voltage. But due to real-world imperfections, the comparator may be deemed to be formed by an ideal comparator in which the first voltage is offset by an offset voltage. For example, suppose that the offset voltage is a positive offset voltage equal to 30 mV. The resulting comparator will thus assert its output terminal when the first voltage is greater than the second voltage minus 30 mV. Conversely, if the offset voltage is a negative offset voltage equal to −30 mV, the comparator will only assert its output signal when the first voltage is greater than the second voltage plus 30 mV.

Figure 1:
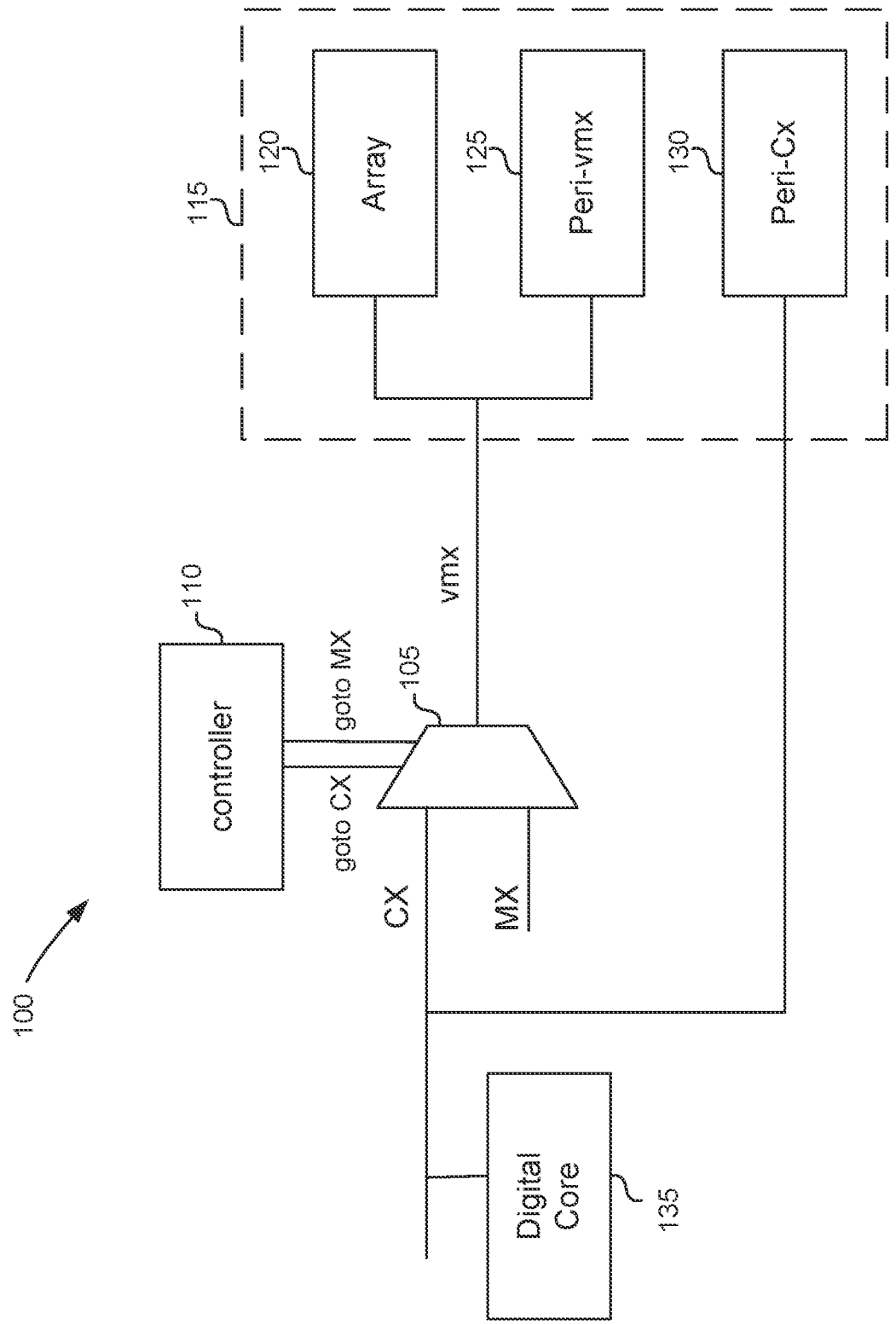
FIG. 1 illustrates an integrated circuit including a power supply multiplexer and a controller in accordance with an aspect of the disclosure.

The offset voltage for a real-world comparator is problematic and can lead to under-voltage or performance issues in the memory. But these issues are solved as further discussed herein. Turning now to the drawings, an example integrated circuit 100 with a controller 110 for controlling a power supply multiplexer 105 is shown in FIG. 1. The power supply multiplexer 105 selects between a core domain (CX) power supply voltage and a memory domain (MX) power supply voltage to provide a selected vmx power supply voltage to an embedded memory 115 such as a static random access memory (SRAM) in integrated circuit 100. The CX power supply voltage is also denoted herein as a first power supply voltage. Similarly, the MX power supply voltage is also denoted herein as a second power supply voltage. The memory 115 includes a bitcell array 120 and associated peripheral logic (e.g., write drivers, write column multiplexers, read column multiplexers, sense amplifier and so on). The peripheral logic is divided into a CX domain portion (Peri-Cx) 130 and a vmx domain portion (Peri-vmx) 125. The CX power supply voltage always powers the CX domain portion 130 of the peripheral logic whereas the vmx power supply voltage as selected by the power supply multiplexer 105 powers the vmx domain portion 125 of the peripheral logic. The vmx power supply voltage powers the bitcell array 120 whereas the CX power supply voltage powers a digital core 135 (e.g., a processor).

Figure 2:
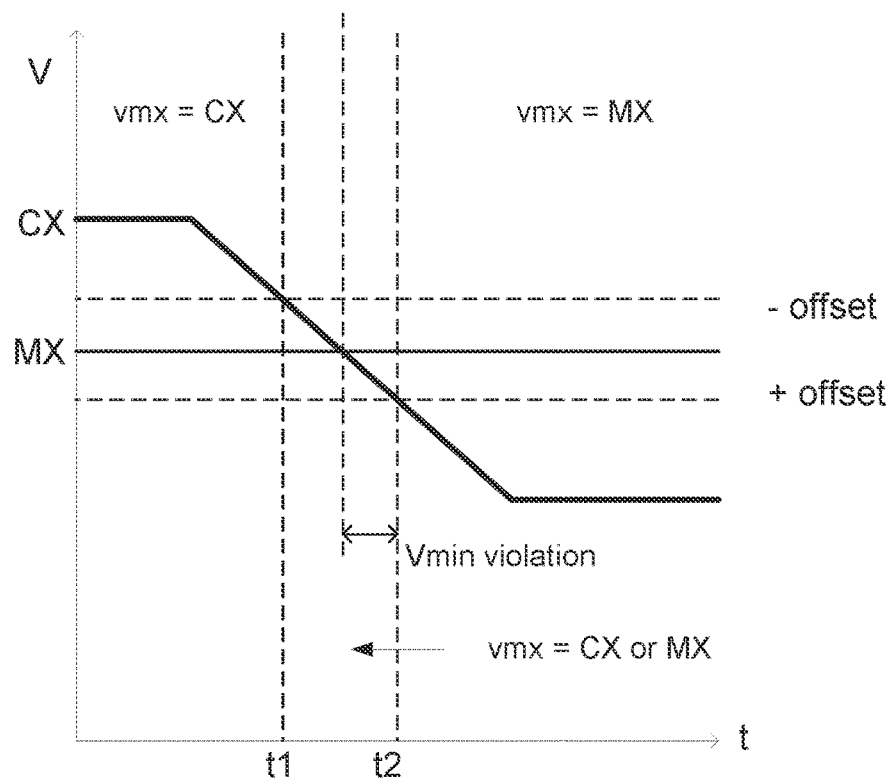
FIG. 2 illustrates a transition of a first power supply voltage from being greater than a sum of a second power supply voltage and a comparator offset voltage to being less than the second power supply voltage minus the comparator offset voltage in the integrated circuit of FIG. 1.

As will be explained further, the controller 110 includes a comparator (not illustrated in FIG. 1) to detect which one of the MX and CX power supply voltages is greater than the other. The controller 110 then commands the power supply multiplexer 105 to select for the greater of the two power supply voltages to produce the vmx power supply voltage. Like any real-world comparator, the comparator in controller 110 will have a voltage offset that affects the comparison between the MX and CX power supply voltages. This voltage offset could then cause an undesirable power supply voltage selection by the power supply multiplexer 105. For example, consider the CX and MX power supply waveforms shown in FIG. 2. The MX power supply does not transition but instead stays constant. Due to a mode transition for the digital core 135 (discussed with regard to FIG. 1), the CX power supply transitions from a relatively high value that is greater than the constant value for the MX power supply voltage to a relatively low value that is less than MX power supply voltage. The offset voltage for the comparison between the CX and MX power supply voltages may be either positive (+ offset) or negative (− offset). Should the offset voltage be negative, the comparator would de-assert its output signal at a time t1 when a sum of the CX power supply and the offset voltage is less than the MX power supply voltage. The transition from the selected power supply voltage vmx equaling the CX power supply voltage to the selected power supply voltage equaling the MX power supply voltage would then occur at time t1.

Conversely, if the offset voltage is positive, the comparator would assert its output signal at a time t2 when the CX power supply voltage is equal to a difference of the MX power supply voltage and the positive offset voltage. Such a positive offset voltage may lead to an under-voltage (Vmin) violation for the memory 115 because the selection of the MX voltage wouldn't occur until time t2 in that case. The vmx power supply voltage would then continue to equal the CX power supply voltage as it drops below the MX power supply voltage until it finally drops below the MX power supply voltage by the positive offset voltage. Should the minimum operating voltage for the bitcell array 120 be some value between the MX power supply voltage and the difference between MX power supply voltage and the positive offset voltage, an under-voltage violation for the memory 115 occurs such that the stored bits in the bitcell array 120 could be lost or corrupted. The transition from the selected power supply voltage vmx equaling the CX power supply voltage to the selected power supply voltage equaling the MX power supply voltage then wouldn't occur until time t2. From time t1 to time t2, the selected power supply voltage vmx may thus either equal the CX or the MX power supply voltage depending upon whether the offset voltage is positive or negative. Prior to time t1, the selected power supply voltage vmx equals the CX power supply voltage, whereas it equals the MX power supply voltage after time t2.

Figure 3:
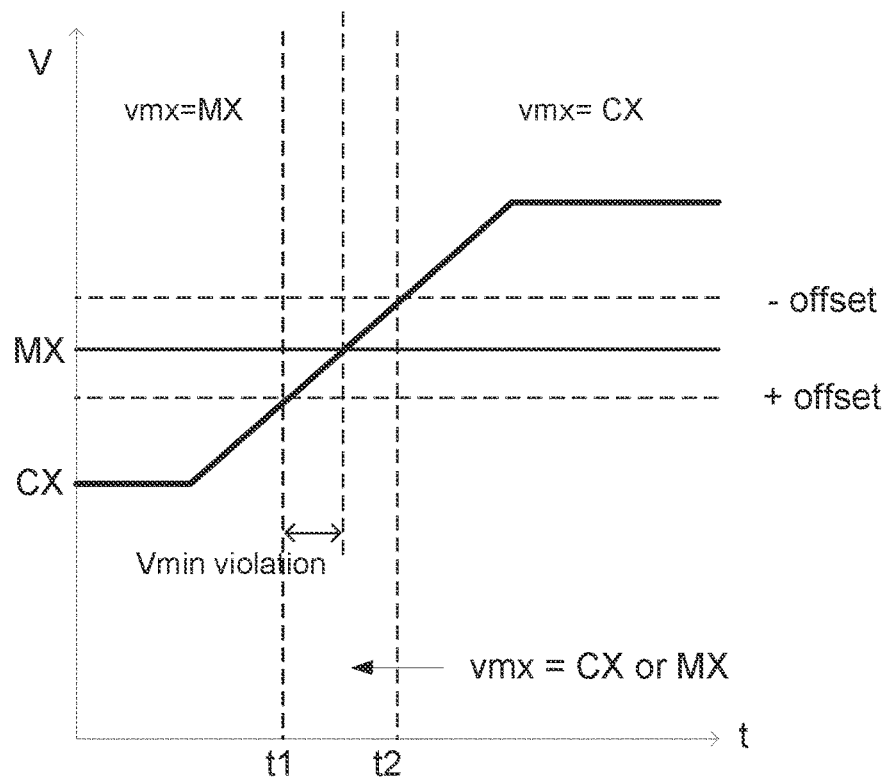
FIG. 3 illustrates a transition of the first power supply voltage from being less than the second power supply voltage minus the comparator offset voltage to being greater than the second power supply voltage plus the comparator offset voltage in the integrated circuit of FIG. 1.

An analogous Vmin violation problem may occur as the CX power supply voltage transitions from low to high as shown in FIG. 3. Should the offset voltage be positive, the CX power supply voltage plus the positive offset voltage equals the MX power supply voltage at time t1. Prior to time t1, the selected power supply voltage vmx equals the MX power supply but with the positive offset, the selected power supply voltage vmx would equal the CX power supply voltage at time t1, which may cause a Vmin violation until the CX power supply voltage finally rises to equal the MX power supply voltage. Should the offset voltage be negative, the selected power supply voltage vmx wouldn't transition to equal the CX power supply until a time t2 at which point the CX power supply voltage minus an absolute value of the negative offset voltage finally equals the MX power supply voltage. The selected power supply voltage vmx would thus be equal to the CX power supply voltage after time t2. From time t1 to time t2, the selected power supply voltage vmx may be equal to either the MX or the CX power supply voltage depending upon whether the offset voltage is a positive or negative value.

Figure 4:
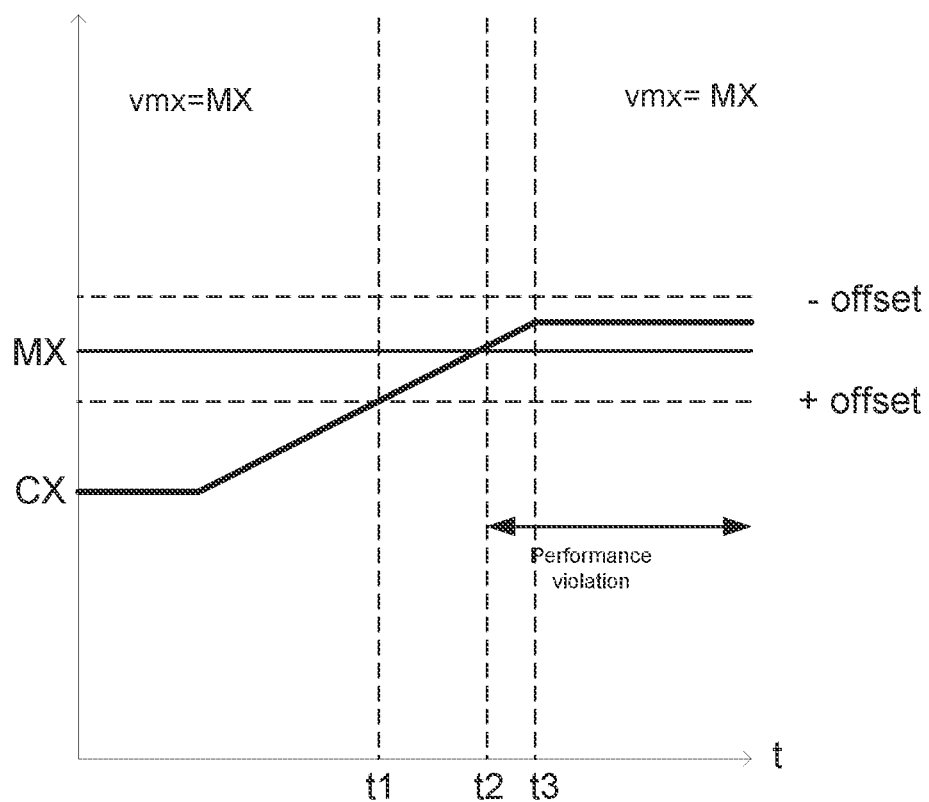
FIG. 4 illustrates a transition of the first power supply voltage from being less than the second power supply voltage minus the comparator offset voltage to being greater than the second power supply but less than the second power supply voltage plus the comparator offset voltage in the integrated circuit of FIG. 1.

In addition to a Vmin violation, the offset voltage may also cause a performance violation for the memory 115. An example low-to-high transition for the CX power supply voltage is shown in FIG. 4. Prior to a time t1, the CX power supply voltage was sufficiently low such that the selected power supply voltage vmx equals the MX power supply voltage. Should the offset voltage be positive, the selected power supply voltage vmx would transition to equal the CX power supply voltage at a time t1. No performance violation would then occur as the CX power supply voltage transitions to a high value that is less than a sum of the MX power supply voltage and an absolute value of the negative offset voltage. But if the offset voltage equals the negative offset voltage, the selected power supply voltage vmx will not transition to equal the CX power supply voltage because the CX power supply voltage does not rise above the sum of the MX power supply voltage and the absolute value of the negative offset voltage. A performance violation thus occurs starting at a time t2 when the selected power supply voltage vmx equals the MX power supply voltage because a transition to the CX power supply would provide better performance for the memory 115.

It will be appreciated that similar Vmin violations and performance violations my occur for high-to-low or low-to-high transitions of the MX power supply voltage. But controller 110 addresses these issues raised by the offset voltage. For example, in the high-to-low transition of the CX power supply voltage discussed for FIG. 2, controller 110 controls the power supply multiplexer 105 to select for the MX power supply voltage at time t1 regardless of whether the offset voltage is positive or negative. This prevents any Vmin violation in memory 115. Similarly, in the low-to-high transition of the CX power supply voltage discussed for FIG. 3, controller 110 controls the power supply multiplexer 105 to select for the CX power supply voltage at time t2 regardless of whether the offset voltage is positive or negative. This again prevents any Vmin violation in memory 115. In addition, controller 110 functions to prevent the performance violation discussed with regard to FIG. 4 by controlling the power supply multiplexer 105 to select for the CX power supply voltage at time t2 regardless of whether the offset voltage is positive or negative.

Figure 5:
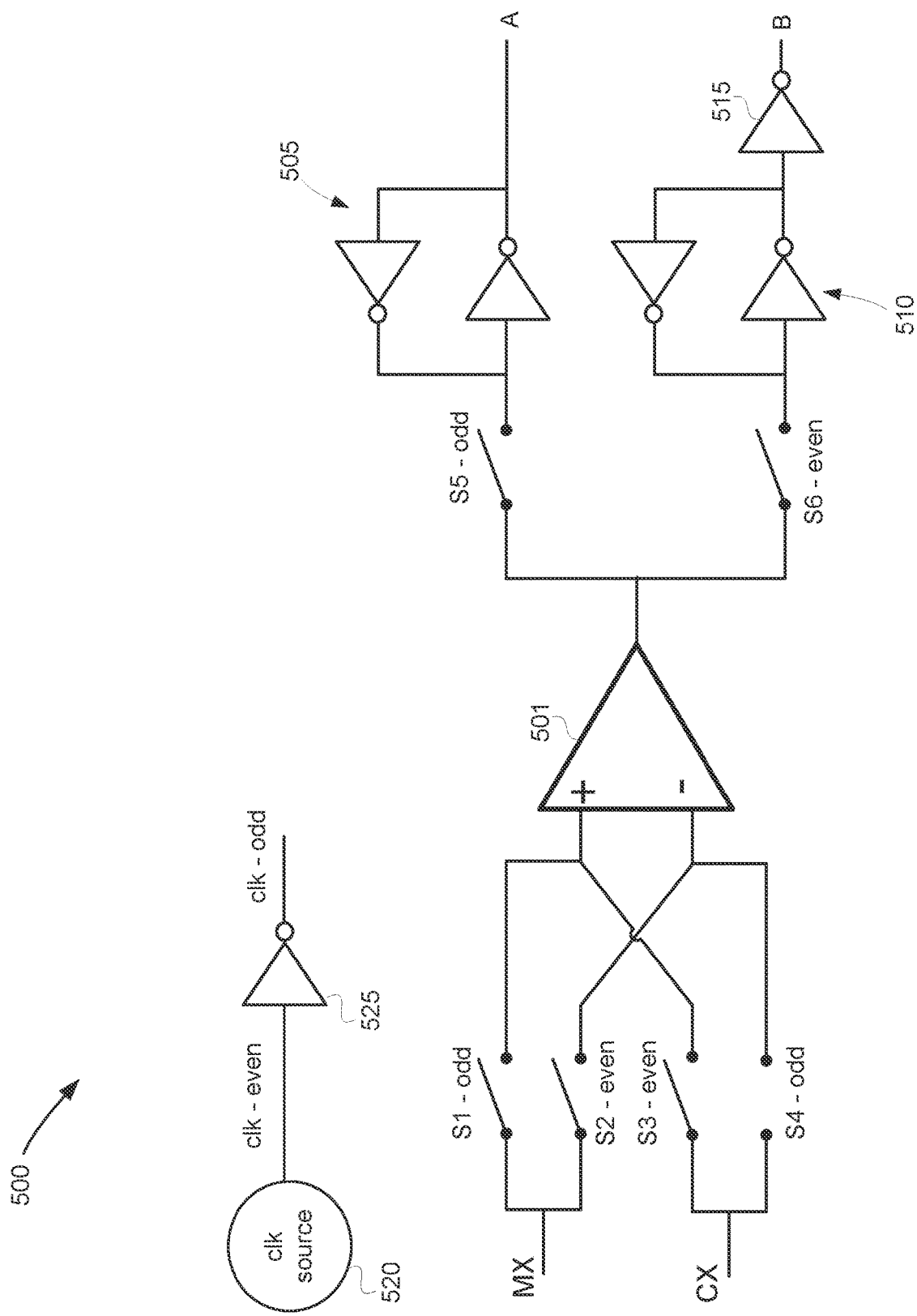
FIG. 5 illustrates a comparator stage in accordance with an aspect of the disclosure.

An example implementation of controller 110 includes a comparator portion 500 shown in FIG. 5. A comparator 501 has both a non-inverting terminal (+) and an inverting terminal (−). The non-inverting terminal is also denoted herein as a first input terminal, whereas the inverting terminal is also denoted herein as a second input terminal. If the comparator 501 were ideal, it would assert its output signal whenever the voltage of the non-inverting terminal exceeded the voltage of the inverting terminal. As used herein, an "asserted" signal is deemed to be true, regardless of whether an active-high or an active-low convention is used. In an active-high convention, the comparator 501 asserts its output signal by charging the output signal to a power supply voltage. In the de-asserted state, the output signal is thus grounded. The following discussion will assume that controller 110 uses an active-high convention although it will be appreciated that an active-low convention could also be implemented.

Due to process, voltage, and temperature variations as well as other non-idealities, the comparator 501 may have either a positive or a negative voltage offset with respect to its comparison of its input terminal voltages. To prevent such voltage offsets from causing Vmin violations or performance violations in the memory 115, comparator 501 switches its input terminals responsive to a cycles of a clock from a clock source 520. The clock source 520 generates a clock signal denoted as the even clock signal (clk-even). An inverter 525 inverts the even clock signal to produce an odd clock signal (clk-odd). The even and odd clock signals control a pair of switches at each input terminal to the comparator 501. These switches will now be described. A switch S1 couples between a node for the MX power supply voltage and the non-inverting terminal. Another switch S2 couples between the node for the MX power supply voltage and the inverting input terminal. Similarly, a switch S3 couples between a node for the CX power supply voltage and the non-inverting terminal, whereas a switch S4 couples between the node for the CX power supply voltage and the inverting input terminal. The node for the CX power supply voltage may also be denoted herein as a first voltage rail. Similarly, the node for the MX power supply voltage may also be denoted herein as a second voltage rail. Switches S3 and S2 are configured to close when the even clock signal is asserted. Similarly, switches S1 and S4 are configured to close when the odd clock signal is asserted. Switches S1, S2, S3, and S4 may also be denoted herein as a first switch, a second switch, a third switch, and a fourth switch, respectively.

Given this switching configuration, the comparator 501 will assert its output signal when the CX power supply voltage is greater than the MX power supply voltage plus the offset voltage (which can be positive or negative) and odd clock signal is asserted. A switch S5 that is configured to close when the odd clock signal is asserted couples between a latch 505 and the output terminal of the comparator 501. Latch 505 inverts the resulting latched output signal of the comparator 501 to form an output signal A. Latch 505 may be formed by a first pair of cross-coupled inverters. The output signal A is thus a binary 0 when the CX power supply voltage is less than a sum of the MX power supply voltage and the voltage offset for the comparator 501. Similarly, the output signal A is a binary 1 when the CX power supply voltage is greater than the sum of the MX power supply voltage and the voltage offset for the comparator 501.

A switch S6 that is configured to close when the even clock signal is asserted couples between a latch 510 and the output terminal of the comparator 501. Latch 510 inverts the resulting latched output signal of the comparator 501 to form a signal that is inverted by an inverter 515 to form an output signal B. Latch 510 may be formed by a second pair of cross-coupled inverters. The output signal B is thus a binary 0 when the CX power supply voltage is less than a difference of the MX power supply voltage and the voltage offset for the comparator 501. Similarly, the output signal B is a binary 1 when the CX power supply voltage is greater than the difference of the MX power supply voltage and the voltage offset for the comparator 501. Switches S5 and S6 may also be denoted herein as a fifth switch and a sixth switch, respectively. Similarly, the latch 505 and the latch 510 may also be denoted herein as a first latch and a second latch, respectively.

Figure 6:
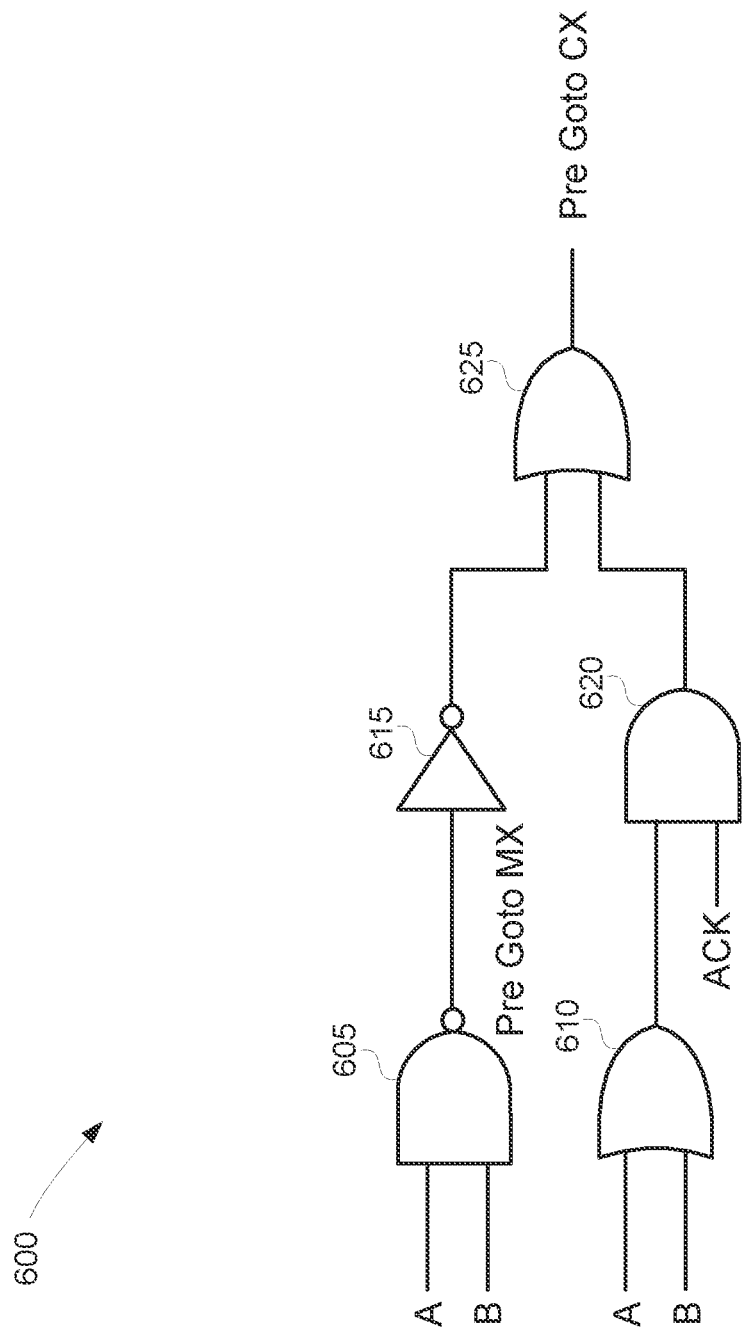
FIG. 6 illustrates a pre-logic stage in accordance with an aspect of the disclosure.

Note the advantages of the switched inputs to the comparator 501: output signal A is the comparison result when the offset voltage is added to the MX power supply, whereas output signal B is the comparison result when the offset voltage is subtracted from the MX power supply voltage. By a suitable processing of the output signals A and B, the controller 110 can thus force the offset to effectively have the correct sign for the corresponding CX (or MX) power supply voltage transition. For example, consider again the high-to-low transition of the CX power supply voltage of FIG. 2. Through a suitable processing of the output signals A and B, the controller 110 may control the power supply multiplexer 105 to always select for the MX power supply at time t1, regardless of whether the offset voltage is actually positive or negative. Such a selection thus avoids any Vmin violation during the high-to-low transition of the CX power supply voltage. For example, controller 110 may include a pre-logic stage 600 shown in FIG. 6 which includes a first logic gate such as a NAND gate 605 for processing the output signals A and B. Referring again to FIGS. 2 and 5, note that both the output signals A and B are binary zeroes prior to time t1 when the CX power supply voltage minus the offset voltage is greater than the MX power supply voltage. Regardless of whether the offset voltage is negative or positive, NAND gate 605 will assert an output signal Pre Goto Mx at time t1 as the CX power supply voltage transitions from high to low. For example, suppose that the offset voltage is positive. In that case, the CX power supply voltage will be less than the MX power supply voltage minus the positive offset at time t1 such that the output signal B is de-asserted (reset to zero). This zero value of the output signal B causes the NAND gate 605 to assert the Pre Goto MX signal. It will be appreciated that the collection of logic gates shown in FIG. 5 for pre-logic stage 600 are merely exemplary and that alternative logic gate combinations may be used to implement pre-logic stage 600.

Figure 7:
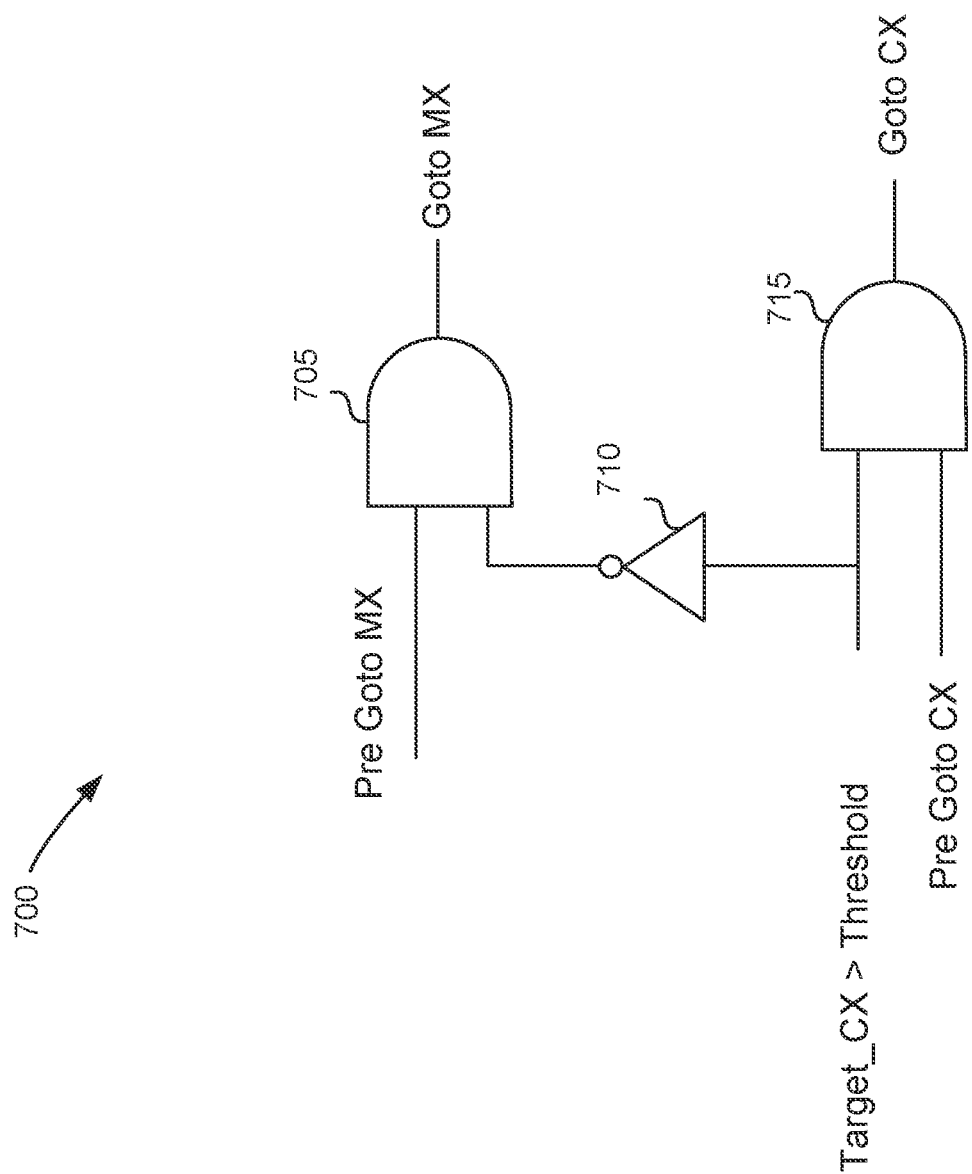
FIG. 7 illustrates a final logic stage in accordance with an aspect of the disclosure.

As shown in FIG. 7, a final logic stage 700 for controller 110 includes a logic gate such as an AND gate 705 that processes the Pre Goto MX signal. Final logic stage 700 also receives a Target_CX signal that is a binary one when the CX power supply voltage is being asserted high greater than a threshold value. In this instance, the CX power supply voltage is transitioning to a low value so the Target_CX signal is a binary zero. An inverter 710 inverts the Target_CX signal to drive the AND gate 705 with an inverted output signal. An output signal Goto MX of the AND gate 705 will thus be asserted when the CX power supply voltage drops below a sum of the MX power supply voltage and an absolute value of the offset voltage (this corresponds to time t1 of FIG. 2) regardless of the offset voltage being positive or negative. Referring again to FIG. 1, the assertion of the Goto MX signal by the controller 110 causes the power supply multiplexer 105 to select for the MX power supply voltage to produce the selected power supply voltage vmx for powering the bitcell array 120 and the vmx-domain peripheral logic 125. The Pre Goto MX signal may also be denoted herein as a first selection signal. It will again be appreciated that the collection of logic gates shown in FIG. 7 for final logic stage 700 are merely exemplary and that alternative logic gate combinations may be used to implement the final logic stage 700.

Referring again to the pre-logic stage 600, an inverter 615 inverts the Pre Goto MX signal to form an inverted signal received by an OR gate 625. A Pre Goto CX output signal of the OR gate will thus be asserted when the Pre Goto Mx signal is de-asserted. The Pre Goto CX output signal is thus asserted whenever the CX power supply voltage is both greater than the MX power supply voltage plus the offset voltage and greater than the MX power supply voltage minus the offset voltage. In final logic stage 700, a logic gate such as an AND gate 715 may AND the Target_CX signal with the Pre Goto CX signal to form a Goto CX signal. Referring again to FIG. 1, the assertion of the Goto CX signal by the controller 110 controls the power supply multiplexer 105 to select for the CX power supply voltage. In the low-to-high transition of the CX power supply voltage shown in FIG. 3, it may thus be appreciated that controller 110 will only transition the power supply multiplexer 105 from selecting the MX power supply voltage to selecting the CX power supply voltage at time t2, thus avoiding any Vmin violations in the low-to-high transition of the CX power supply voltage. The Pre Goto CX signal may also be denoted herein as a second selection signal.

To prevent the performance violation discussed with regard to FIG. 4, the pre-logic stage 600 may include a second logic gate such as an OR gate 610 that ORs the output signal A with the output signal B. An output signal of the OR gate 610 will thus be asserted when either the CX power supply voltage is greater than the MX power supply plus the offset voltage or when the CX power supply voltage is greater than the MX power supply minus the offset voltage. A power management circuit (not illustrated) that controls the transition of the CX power supply voltage asserts an acknowledgement signal (ACK) when a low-to-high transition of the CX power supply voltage is complete. Referring to FIG. 4, the acknowledgment signal is thus asserted at a time t3. The pre-logic stage 600 may also include a logic gate such as an AND gate 620 that ANDs the output signal from the OR gate 610 with the acknowledgment signal. An output signal from the AND gate 620 will thus be asserted only when the acknowledgement signal is true and either the CX power supply voltage is greater than the MX power supply plus the offset voltage or the CX power supply voltage is greater than the MX power supply minus the offset voltage. The OR gate 625 ORs the output signal from the inverter 615 with the output signal from the AND gate 620. Thus, the Pre Goto CX signal will be asserted only at time t3 of FIG. 4, which in turn causes the Goto CX signal to be asserted to cause the selection of the CX power supply voltage at the power supply multiplexer 105.

Figure 8:
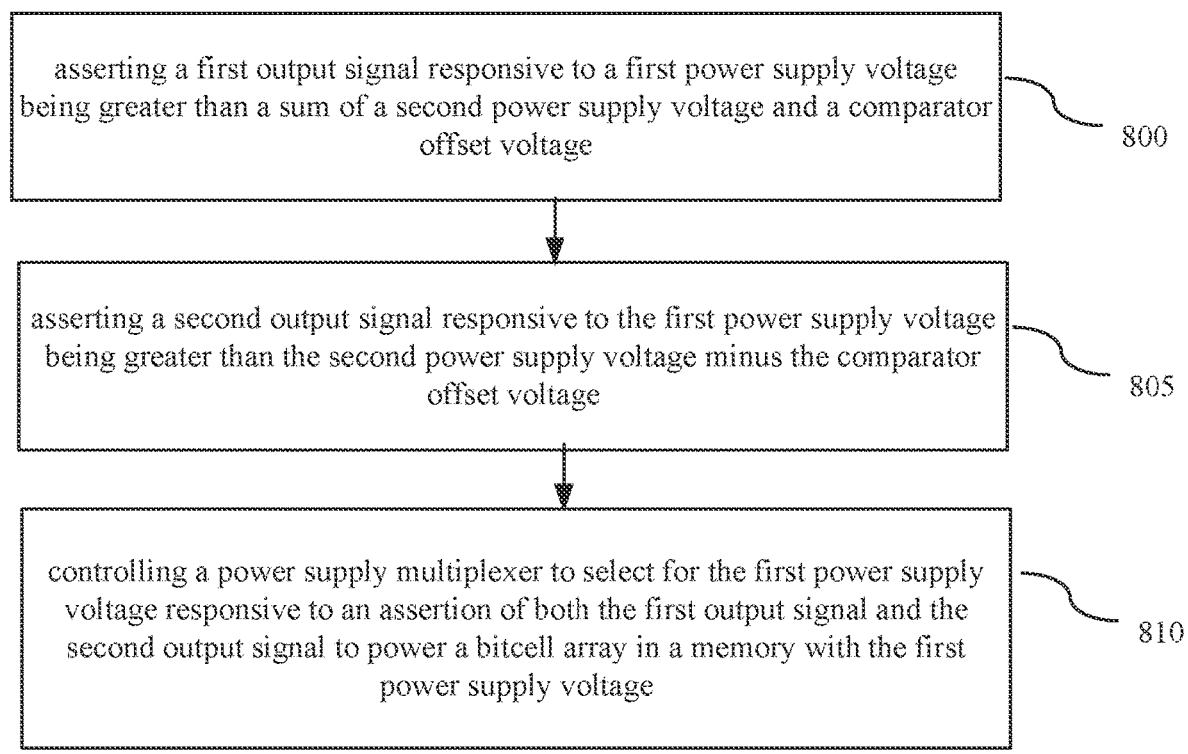
FIG. 8 is a flowchart for a method of selecting a memory power supply voltage in accordance with an aspect of the disclosure.

A method of selecting a power supply voltage will now be discussed with regard to the flowchart of FIG. 8. The method occurs during a transition of a first power supply voltage from being less than a second power supply voltage to being greater than the second power supply voltage. An example of the first power supply voltage is the CX power supply voltage, whereas the MX power supply voltage is an example of the second power supply voltage during the transition discussed with regard to FIG. 2. The method includes an act 800 of asserting a first output signal responsive to a first power supply voltage being greater than a sum of a second power supply voltage and a comparator offset voltage. The assertion of the output signal A is an example of act 800. The output signal A may thus also be denoted herein as a first output signal. The method also includes an act 805 of asserting a second output signal responsive to the first power supply voltage being greater than the second power supply voltage minus the comparator offset voltage. The assertion of the output signal B is an example of act 805. The output signal B may thus also be denoted herein as a second output signal. Finally, the method includes an act 810 of controlling a power supply multiplexer to select for the first power supply voltage responsive to an assertion of both the first output signal and the second output signal to power a bitcell array in a memory with the first power supply voltage. The control of the power supply multiplexer 105 by controller 110 is an example of act 810.

Figure 9:
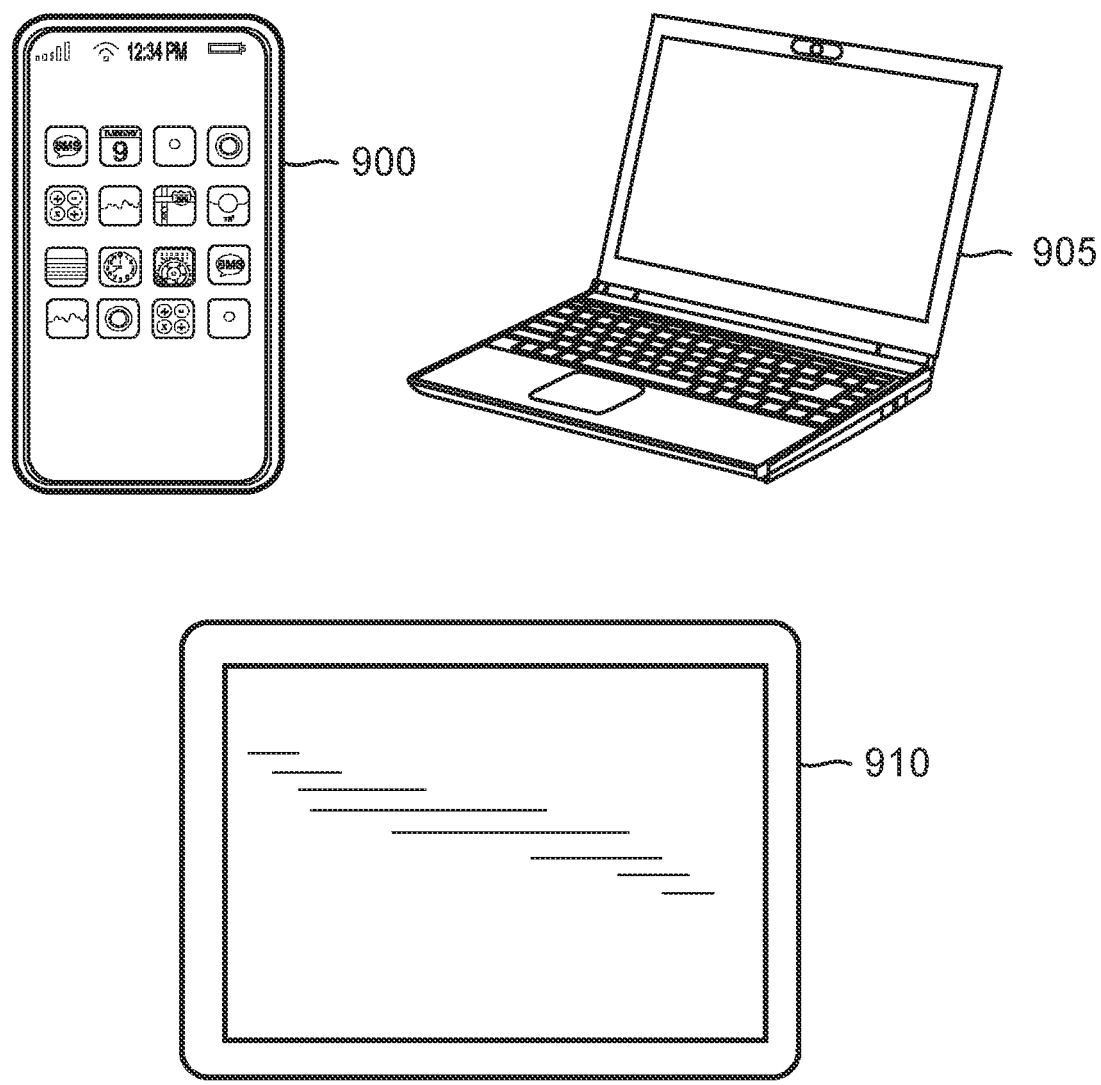
FIG. 9 illustrates some example electronic systems including an integrated circuit having a power supply multiplexer and a controller in accordance with an aspect of the disclosure.

An integrated circuit having a power supply multiplexer and controller as disclosed herein may be advantageously employed in a wide variety of electronic systems. For example, as shown in FIG. 9, a cellular telephone 900, a laptop computer 9505, and a tablet PC 910 may all include an integrated circuit having a power supply multiplexer and controller in accordance with the disclosure. Other exemplary electronic systems such as a music player, a video player, a communication device, and a personal computer may also be configured with an integrated circuit having a power supply multiplexer and controller constructed in accordance with the disclosure.

The disclosure will now be summarized in the following series of clauses:

Clause 1. An integrated circuit, comprising:
a memory including a bitcell array;
a first voltage rail for a first power supply voltage;
a second voltage rail for a second power supply voltage;
a power supply multiplexer configured to select between the first power supply voltage and the second power supply voltage to provide a selected power supply voltage for powering the bitcell array; and
a controller including a comparator stage configured to switch between a first configuration in which a first input terminal of a comparator in the comparator stage is coupled to the first voltage rail and in which a second input terminal of the comparator is coupled to the second voltage rail and a second configuration in which the first input terminal is coupled to the second voltage rail and in which the second input terminal is coupled to the first voltage rail, the controller being configured to control the power supply multiplexer to select between the first power supply voltage and the second power supply voltage responsive to a first output signal and a second output signal of the comparator stage during an operation of the comparator stage in the first configuration and in the second configuration.

Clause 2. The integrated circuit of clause 1, further comprising:
a clock source configured to provide a clock signal; and
a first inverter configured to invert the clock signal to provide an inverted clock signal, wherein the comparator stage is configured to respond to an assertion of the clock signal to switch into the first configuration and to respond to an assertion of the inverted clock signal to switch into the second configuration.

Clause 3. The integrated circuit of clause 2, further comprising:
a first switch coupled between the first voltage rail and the first input terminal,
a second switch coupled between the first voltage rail and the second input terminal;
a third switch coupled between the second voltage rail and the first input terminal; and
a fourth switch coupled between the second voltage rail and the second input terminal, wherein the first switch and the fourth switch are configured to close responsive to the assertion of the inverted clock signal, and wherein the second switch and the third switch are configured to close responsive to the assertion of the clock signal.

Clause 4. The integrated circuit of any of clauses 2-3, wherein the comparator stage further includes:

a first latch;
a second latch;
a fifth switch coupled between an output terminal of the comparator and in input terminal of the first latch, wherein the fifth switch is configured to close responsive to the assertion of the inverted clock signal to cause the first latch to output the first output signal;
a sixth switch coupled between the output terminal of the comparator and an input terminal of the second latch, wherein the sixth switch is configured to close responsive to the assertion of the clock signal; and
a second inverter configured to invert a latched signal from the second latch to form the second output signal.

Clause 5. The integrated circuit of clause 4, wherein the first latch comprises a first pair of cross-coupled pair of inverters, and wherein the second latch comprises a second pair of cross-coupled inverters.

Clause 6. The integrated circuit of any of clauses 1-5, wherein the comparator stage is configured to assert the first output signal responsive to the first power supply voltage being greater than a sum of the second power supply voltage and an offset voltage of the comparator and to assert the second output signal responsive to the first power supply voltage being greater than the second power supply voltage minus the offset voltage.

Clause 7. The integrated circuit of any of clauses 1-6, wherein the comparator stage is further configured to de-assert the first output signal responsive to the first power supply voltage being less than a sum of the second power supply voltage and an offset voltage of the comparator and to de-assert the second output signal responsive to the first power supply voltage being less than the second power supply voltage minus the offset voltage.

Clause 8. The integrated circuit of clause 7, wherein the controller further includes:
a first logic gate configured to process the first output signal and the second output signal to form a first selection signal, and wherein the controller is further configured to control the power supply multiplexer to select for the second power supply voltage responsive to a binary value of the first selection signal.

Clause 9. The integrated circuit of clause 8, wherein the first logic gate comprises a NAND gate.

Clause 10. The integrated circuit of clause 8, further comprising:
an inverter configured to invert the first selection signal to form an inverted output signal, and
a second logic gate configured to process the inverted output signal to form a second selection signal, wherein the controller is further configured to control the power supply multiplexer to select for the first power supply voltage responsive to a binary value of the second selection signal.

Clause 11. The integrated circuit of clause 10, wherein the second logic gate comprises an OR gate.

Clause 12. The integrated circuit of any of clauses 1-11, further comprising: a digital core configured to be powered by the first power supply voltage.

Clause 13. The integrated circuit of any of clauses 1-11, wherein the integrated circuit is included within a cellular telephone.

Clause 14. The integrated circuit of any of clauses 1-11, wherein the controller is further configured to control the power supply multiplexer to select between the first power supply voltage and the second power supply voltage responsive to an acknowledgement signal that is asserted responsive to the first power supply voltage completing a voltage level transition.

Clause 15. A method of selecting a power supply voltage, comprising:
during a transition of a first power supply voltage from being less than a second power supply voltage to being greater than the second power supply voltage:
asserting a first output signal responsive to a first power supply voltage being greater than a sum of a second power supply voltage and a comparator offset voltage;
asserting a second output signal responsive to the first power supply voltage being greater than the second power supply voltage minus the comparator offset voltage; and
controlling a power supply multiplexer to select for the first power supply voltage responsive to an assertion of both the first output signal and the second output signal to power a bitcell array in a memory with the first power supply voltage.

Clause 16. The method of clause 15, further comprising:
determining in a comparator having the comparator offset voltage that the first supply voltage is greater than the sum of the second power supply voltage and the comparator offset voltage by coupling a first input terminal of the comparator to a first voltage rail for the first power supply voltage and by coupling a second input terminal of the comparator to a second voltage rail for the second power supply voltage.

Clause 17. The method of clause 16, further comprising:
determining in the comparator having the comparator offset voltage that the first supply voltage is greater than the second power supply voltage minus the comparator offset voltage by coupling the first input terminal of the comparator to the first voltage and by coupling the second input terminal of the comparator to the second voltage rail.

Clause 18. The method of clause 16, further comprising:
controlling the power supply multiplexer to select for the second power supply voltage prior to the assertion of both the first output signal and the second output signal to power a bitcell array in a memory with the second power supply voltage.

Clause 19. An integrated circuit, comprising:
a power supply multiplexer; and
a controller configured to control the power supply multiplexer to select between a first power supply voltage and a second power supply voltage to provide a selected power supply voltage responsive to a determination of whether the first power supply voltage is greater than the second power supply voltage plus a voltage offset and responsive to a determination of whether the first power supply voltage is greater than the second power supply voltage minus the voltage offset.

Clause 20. The integrated circuit of clause 19, further comprising a comparator to compare the first power supply voltage and the second power supply voltage, wherein the voltage offset is a comparator voltage offset of the comparator.

Clause 21. The integrated circuit of any of clauses 19-20, further comprising:
a memory including a bitcell array configured to be powered by the selected power supply voltage.

Clause 22. The integrated circuit of any of clauses 19-20, further comprising:

a digital core configured to be powered by the first power supply voltage.

Clause 23. The integrated circuit of clause 22, wherein the digital core comprises a processor.

Clause 24. The integrated circuit of clause 21, wherein the memory comprises a static random access memory.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. An integrated circuit, comprising:
a memory including a bitcell array;
a first voltage rail for a first power supply voltage;
a second voltage rail for a second power supply voltage;
a power supply multiplexer configured to select between the first power supply voltage and the second power supply voltage to provide a selected power supply voltage for powering the bitcell array; and
a controller including a comparator stage configured to switch between a first configuration in which a first input terminal of a comparator in the comparator stage is coupled to the first voltage rail and in which a second input terminal of the comparator is coupled to the second voltage rail and a second configuration in which the first input terminal is coupled to the second voltage rail and in which the second input terminal is coupled to the first voltage rail, the controller being configured to control the power supply multiplexer to select between the first power supply voltage and the second power supply voltage responsive to a first output signal and a second output signal of the comparator stage during an operation of the comparator stage in the first configuration and in the second configuration.

2. The integrated circuit of claim 1, further comprising:
a clock source configured to provide a clock signal; and
a first inverter configured to invert the clock signal to provide an inverted clock signal, wherein the comparator stage is configured to respond to an assertion of the clock signal to switch into the first configuration and to respond to an assertion of the inverted clock signal to switch into the second configuration.

3. The integrated circuit of claim 2, further comprising:
a first switch coupled between the first voltage rail and the first input terminal,
a second switch coupled between the first voltage rail and the second input terminal;
a third switch coupled between the second voltage rail and the first input terminal; and
a fourth switch coupled between the second voltage rail and the second input terminal, wherein the first switch and the fourth switch are configured to close responsive to the assertion of the inverted clock signal, and wherein the second switch and the third switch are configured to close responsive to the assertion of the clock signal.

4. The integrated circuit of claim 2, wherein the comparator stage further includes:
a first latch;
a second latch;

a fifth switch coupled between an output terminal of the comparator and in input terminal of the first latch, wherein the fifth switch is configured to close responsive to the assertion of the inverted clock signal to cause the first latch to output the first output signal;

a sixth switch coupled between the output terminal of the comparator and an input terminal of the second latch, wherein the sixth switch is configured to close responsive to the assertion of the clock signal; and a second inverter configured to invert a latched signal from the second latch to form the second output signal.

5. The integrated circuit of claim 4, wherein the first latch comprises a first pair of cross-coupled pair of inverters, and wherein the second latch comprises a second pair of cross-coupled inverters.

6. The integrated circuit of claim 1, wherein the comparator stage is configured to assert the first output signal responsive to the first power supply voltage being greater than a sum of the second power supply voltage and an offset voltage of the comparator and to assert the second output signal responsive to the first power supply voltage being greater than the second power supply voltage minus the offset voltage.

7. The integrated circuit of claim 1, wherein the comparator stage is further configured to de-assert the first output signal responsive to the first power supply voltage being less than a sum of the second power supply voltage and an offset voltage of the comparator and to de-assert the second output signal responsive to the first power supply voltage being less than the second power supply voltage minus the offset voltage.

8. The integrated circuit of claim 7, wherein the controller further includes:
a first logic gate configured to process the first output signal and the second output signal to form a first selection signal, and wherein the controller is further configured to control the power supply multiplexer to select for the second power supply voltage responsive to a binary value of the first selection signal.

9. The integrated circuit of claim 8, wherein the first logic gate comprises a NAND gate.

10. The integrated circuit of claim 8, further comprising:
an inverter configured to invert the first selection signal to form an inverted output signal, and
a second logic gate configured to process the inverted output signal to form a second selection signal, wherein the controller is further configured to control the power supply multiplexer to select for the first power supply voltage responsive to a binary value of the second selection signal.

11. The integrated circuit of claim 10, wherein the second logic gate comprises an OR gate.

12. The integrated circuit of claim 1, further comprising:
a digital core configured to be powered by the first power supply voltage.

13. The integrated circuit of claim 1, wherein the integrated circuit is included within a cellular telephone.

14. The integrated circuit of claim 1, wherein the controller is further configured to control the power supply multiplexer to select between the first power supply voltage and the second power supply voltage responsive to an acknowledgement signal that is asserted responsive to the first power supply voltage completing a voltage level transition.

15. A method of selecting a power supply voltage, comprising:

during a transition of a first power supply voltage from being less than a second power supply voltage to being greater than the second power supply voltage:
asserting a first output signal responsive to a first power supply voltage being greater than a sum of a second power supply voltage and a comparator offset voltage;
asserting a second output signal responsive to the first power supply voltage being greater than the second power supply voltage minus the comparator offset voltage; and
controlling a power supply multiplexer to select for the first power supply voltage responsive to an assertion of both the first output signal and the second output signal to power a bitcell array in a memory with the first power supply voltage.

16. The method of claim 15, further comprising:
determining in a comparator having the comparator offset voltage that the first supply voltage is greater than the sum of the second power supply voltage and the comparator offset voltage by coupling a first input terminal of the comparator to a first voltage rail for the first power supply voltage and by coupling a second input terminal of the comparator to a second voltage rail for the second power supply voltage.

17. The method of claim 16, further comprising:
determining in the comparator having the comparator offset voltage that the first supply voltage is greater than the second power supply voltage minus the comparator offset voltage by coupling the first input terminal of the comparator to the first voltage and by coupling the second input terminal of the comparator to the second voltage rail.

18. The method of claim 16, further comprising:
controlling the power supply multiplexer to select for the second power supply voltage prior to the assertion of both the first output signal and the second output signal to power a bitcell array in a memory with the second power supply voltage.

19. An integrated circuit, comprising;
a power supply multiplexer; and
a controller configured to control the power supply multiplexer to select between a first power supply voltage and a second power supply voltage to provide a selected power supply voltage responsive to a determination of whether the first power supply voltage is greater than the second power supply voltage plus a voltage offset and responsive to a determination of whether the first power supply voltage is greater than the second power supply voltage minus the voltage offset.

20. The integrated circuit of claim 19, further comprising a comparator to compare the first power supply voltage and the second power supply voltage, wherein the voltage offset is a comparator voltage offset of the comparator.

21. The integrated circuit of claim 19, further comprising:
a memory including a bitcell array configured to be powered by the selected power supply voltage.

22. The integrated circuit of claim 19, further comprising:
a digital core configured to be powered by the first power supply voltage.

23. The integrated circuit of claim 22, wherein the digital core comprises a processor.

24. The integrated circuit of claim 21, wherein the memory comprises a static random access memory.

* * * * *